(12) United States Patent
 Jin et al.

(10) Patent No.: US 11,168,846 B2
(45) Date of Patent: Nov. 9, 2021

(54) ELECTRONIC DEVICE, ELECTRONIC MODULE AND ELECTRONIC DEVICE ASSEMBLY

(71) Applicant: Tyco Electronics (Shanghai) Co. Ltd., Shanghai (CN)

(72) Inventors: Jiwang Jin, Shanghai (CN); Hongqiang Han, Shanghai (CN); WenYu Liu, Shanghai (CN); Chenxi Wang, Shanghai (CN); Xingjie Ge, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 17/096,235

(22) Filed: Nov. 12, 2020

(65) Prior Publication Data
 US 2021/0148522 A1  May 20, 2021

(30) Foreign Application Priority Data

Nov. 19, 2019 (CN) .......................... 201911138328.9

(51) Int. Cl.
 *F21K 9/61* (2016.01)
 *H01L 33/58* (2010.01)
 *H01L 33/62* (2010.01)
 *H01R 12/70* (2011.01)
 *H05K 9/00* (2006.01)

(52) U.S. Cl.
 CPC ................ *F21K 9/61* (2016.08); *H01L 33/58* (2013.01); *H01L 33/62* (2013.01); *H01R 12/7017* (2013.01); *H05K 9/0058* (2013.01); *F21V 2200/00* (2015.01)

(58) Field of Classification Search
 None
 See application file for complete search history.

(56) References Cited

U.S. PATENT DOCUMENTS

2014/0029307 A1\* 1/2014 Yu ........................ G02B 6/0011
                                                                 362/623

\* cited by examiner

*Primary Examiner* — Vip Patel
(74) *Attorney, Agent, or Firm* — Barley Snyder

(57) ABSTRACT

An electronic device includes a plurality of sub-electronic modules arranged side by side. Each of the sub-electronic modules includes a housing having a top wall, a bottom wall, and a pair of side walls, and a light guide pipe mounted on one of the side walls. The light guide pipe has an incident end, an emergent end located at a front portion of the housing, and a main body located between the incident end and the emergent end and extending in a length direction of the housing. The incident ends of the light guide pipes located between at least a pair of adjacent housings are staggered by a predetermined distance in the length direction.

19 Claims, 6 Drawing Sheets

ELECTRONIC DEVICE, ELECTRONIC MODULE AND ELECTRONIC DEVICE ASSEMBLY

CROSS-REFERENCE TO RELATED APPLICATION

This application claims the benefit of the filing date under 35 U.S.C. § 119(a)-(d) of Chinese Patent Application No. 201911138328.9, filed on Nov. 19, 2019.

FIELD OF THE INVENTION

The present invention relates to an electronic device and, more particularly, to an electronic device with a working status indication function.

BACKGROUND

In an electronic device such as an electrical connector (such as a QSFP-DD (Quad Small Form-factor Pluggable double-density connector), a photoelectric conversion module and the like is usually provided with an indicator light for indicating a working state thereof. In an exemplary embodiment of the related art, a plurality of electronic devices are mounted on a circuit board, and a light-emitting device such as a light emitting diode (LED) for indicating the working state of the electronic device is mounted outside a housing of each electronic device, and a light guide pipe is mounted outside the housing. The light guide pipe has an input end facing the light-emitting device, and an output end passing through a through hole in a panel mounted at the front of the electronic device and being exposed therefrom.

In such an electronic device, a light-emitting state of the light-emitting device (such as light-emitting or darkening, or change in light-emitting color) may indicate the working state of the electronic device. A light generated by the light-emitting device is transmitted to the front of the panel through the light guide pipe. Therefore, an operator may judge the working state of the electronic device by observing the light-emitting state of the output end of the light guide pipe from the front of the panel.

In the related art, due to the limitation to a volume of a housing, a distance between two adjacent electronic devices needs to be reduced. However, if the light guide pipes of the adjacent electronic devices are too close, there is a risk of cross-lighting, and the light-emitting state of a specific light-emitting device cannot be clearly distinguished at the front of the panel, thereby affecting a judgment of the working state of the electronic device.

SUMMARY

An electronic device includes a plurality of sub-electronic modules arranged side by side. Each of the sub-electronic modules includes a housing having a top wall, a bottom wall, and a pair of side walls, and a light guide pipe mounted on one of the side walls. The light guide pipe has an incident end, an emergent end located at a front portion of the housing, and a main body located between the incident end and the emergent end and extending in a length direction of the housing. The incident ends of the light guide pipes located between at least a pair of adjacent housings are staggered by a predetermined distance in the length direction.

BRIEF DESCRIPTION OF THE DRAWINGS

The invention will now be described by way of example with reference to the accompanying Figures, of which.

DETAILED DESCRIPTION OF THE EMBODIMENTS

Figure 1:
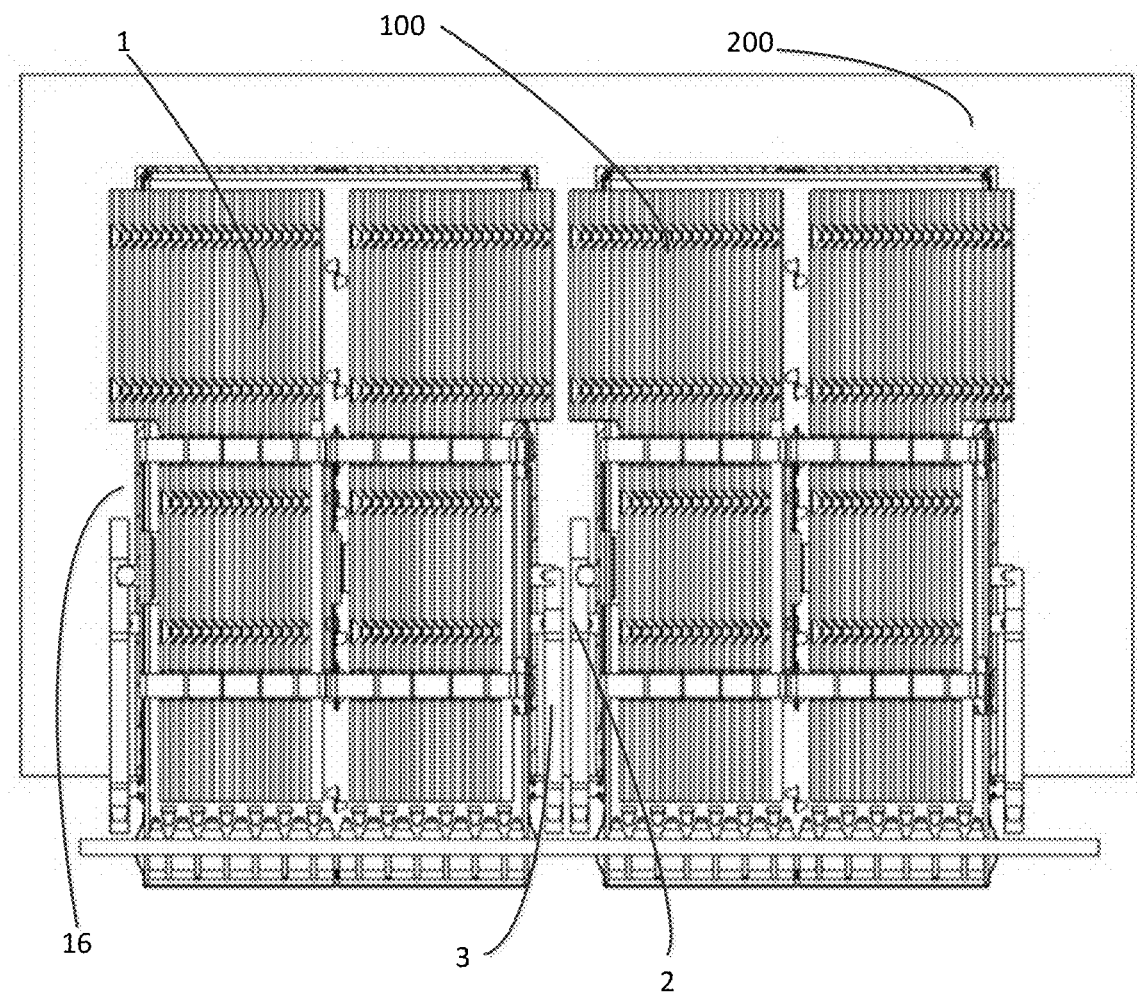
FIG. 1 is a top view of an electronic device assembly according to an embodiment.

The technical solution of the disclosure will be described hereinafter in further detail with reference to the following embodiments, taken in conjunction with the accompanying drawings. In the description, the same or similar reference numerals indicate the same or similar parts. The description of the embodiments of the disclosure hereinafter with reference to the accompanying drawings is intended to explain the general inventive concept of the disclosure and should not be construed as a limitation on the disclosure.

In addition, in the following detailed description, for the sake of explanation, numerous specific details are set forth in order to provide a thorough understanding of the disclosed embodiments. It will be apparent, however, that one or more embodiments may also be practiced without these specific details. In other instances, well-known structures and devices are illustrated schematically in order to simplify the drawing.

As shown in FIGS. 1 to 4, an electronic device according to an exemplary embodiment comprises a plurality of sub-electronic modules 100 arranged side by side in a lateral direction. Each of the sub-electronic modules 100 includes a housing 1 and a light guide pipe 2 or 3 mounted on a side wall 11 of the housing 1. The housing 1 is mounted on a circuit board 200 or other mounting frames. The light guide pipe 2 or 3 has an incident end 21 or 31, an emergent end 22 or 32 located at a front portion of the housing 1, and a main body located between the incident end and the emergent end and extending in a length direction of the housing 1. The incident ends 21 and 31 of the light guide pipes 2 and 3 located between at least a pair of adjacent housings 1 are staggered by a predetermined distance D in the length direction.

In an embodiment, the incident ends 21 and 31 have a substantially same outer contour of generally circular shape. The predetermined distance D, shown in FIG. 3, may be a distance between corresponding portions on the incident ends 21 and 31, for example, a distance between center points of the incident ends 21 and 31. Correspondingly, light sources (such as a light-emitting diode) corresponding to the light guide pipes 2 and 3 will also be staggered by the predetermined distance D in the length direction of the housing 1, thereby avoiding a crosstalk of the light emitting from the light source to the two incident ends 21 and 31 of the light guide pipes 2 and 3. In this case, there is no need to coat the incident ends 12 and 31 of the light guide pipes 2 and 3 with a light shielding material, and there is also no need to additionally mount a light shielding component on the incident ends 12 and 31 of the light guide pipes 2 and 3, which saves the cost of electronic device.

In an exemplary embodiment, the predetermined distance D is not less than a maximum outer diameter of the incident end 21 and 31. That is, the incident ends 21 and 31 of the two light guide pipes 2 and 3 are completely staggered in the length direction. In other words, projections of the two incident ends 21 and 31 in a lateral direction are not overlapped with each other. In this way, it is possible to further ensure that the crosstalk of the light emitted from the light source to the incident ends 21 and 31 of the light guide pipes 2 and 3 does not occur.

Figure 2:
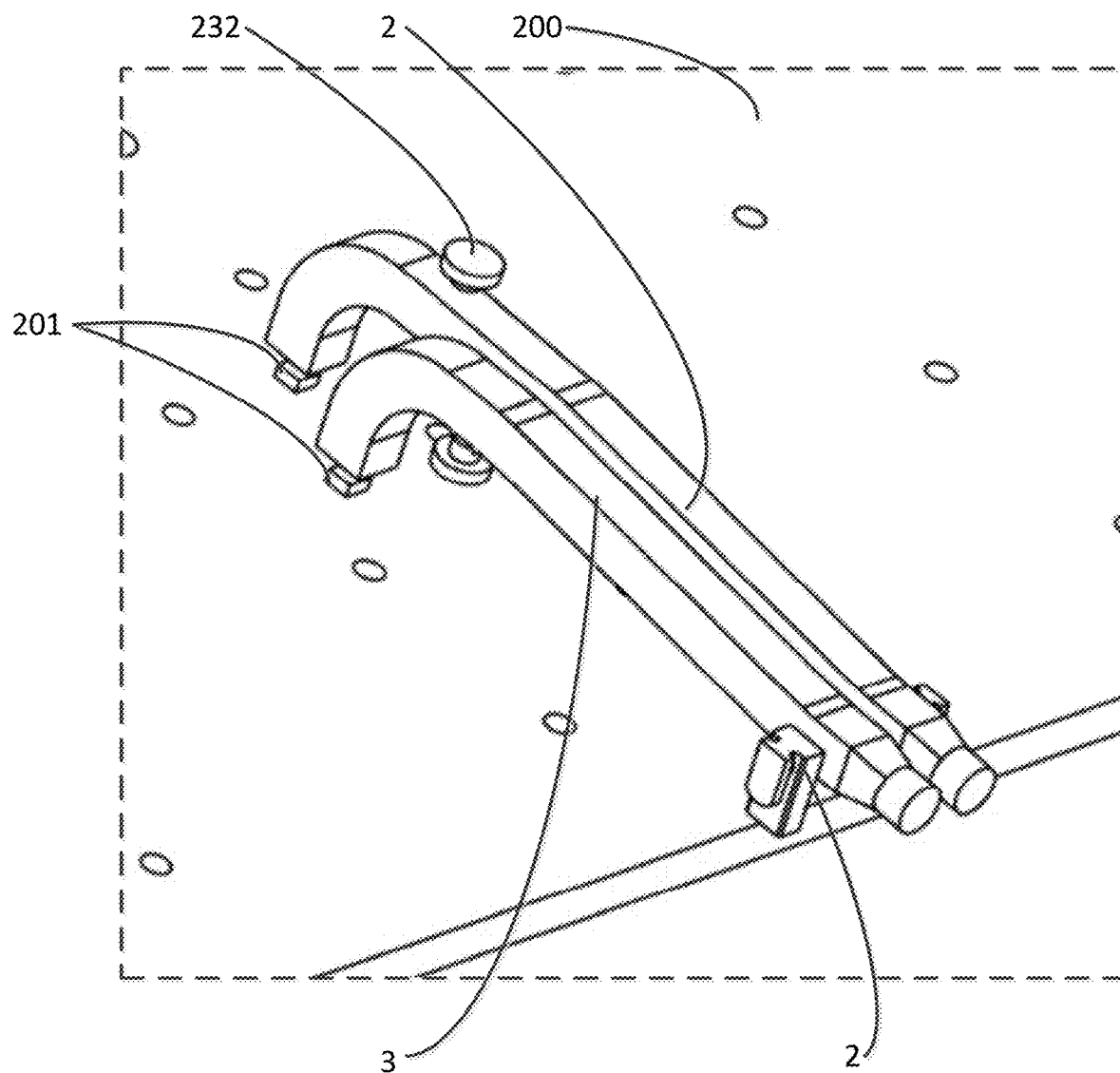
FIG. 2 is a perspective view of a pair of adjacent light guide pipes of the electronic device assembly mounted on a circuit board.
Figure 3:
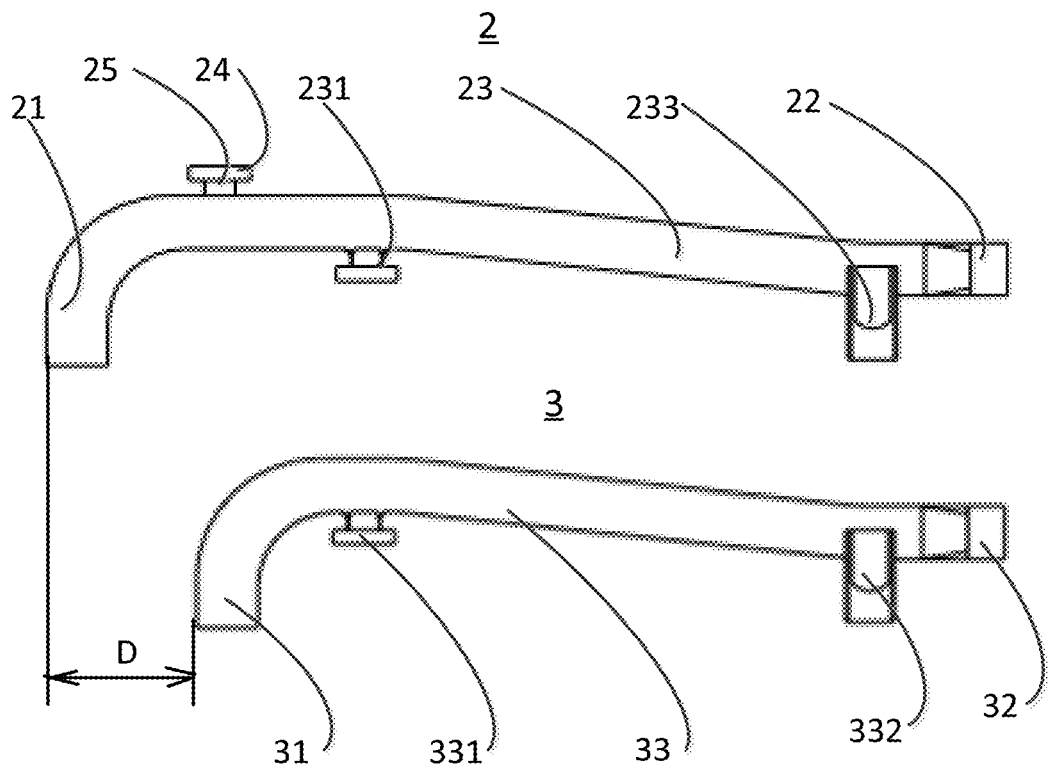
FIG. 3 is a schematic side view of a pair of light guide pipes according to an embodiment.

In an exemplary embodiment, as shown in FIGS. 2 and 3, each of the light guide pipes 2 and 3 has a substantially L shape, and the incident end 21 and 31 is substantially perpendicular to the main body and extends in a height direction. The main body 23 (hereafter referred as a first main body 23) of the light guide pipe 2 has a length greater than that of the main body 33 (hereafter referred as a second main body 33) of the light guide pipe 33.

In an exemplary embodiment, as shown in FIGS. 2 to 7, the first main body 23 has a first lower engagement portion 231 on a lower portion thereof, a first upper engagement portion 232 on an upper portion thereof, and a first side engagement portion 233 on a side wall thereof. The second main body 33 has a second lower engagement portion 331 on a lower portion thereof and a second side engagement portion 332 on a side wall thereof. The side wall 11 of the housing 1 has, on an outer side thereof, a first mating engagement portion 12 mated with the first lower engagement portion 231 or the second lower engagement portion 331, a second mating engagement portion 13 mated with the first upper engagement portion 232, and a third mating engagement portion 14 mated with the first side engagement portion 233 or the second side engagement portion 332.

In other words, the light guide pipe 2 having the longer first main body 23 is provided with three engagement portions 231, 232, 233, and the light guide pipe having the shorter second main body 33 is provided with two engagement portions 331, 332. The second lower engagement portion 331 and the second side engagement portion 332 of the second light guide pipe 3 and the first lower engagement portion 231 and the first side engagement portion 233 of the first light guide pipe 2 may be engaged with the same first mating engagement portion 13 and the third engagement portion 14 on the side wall 11 of the housing 1, respectively. With this structure, the side wall 11 of the housing 1 may be either selectively mounted with the light guide pipe 2 with the longer first body, or selectively mounted with the light guide 3 with the shorter second body 33. Thus, the application range of the side wall 11 of the housing 1 is increased and the cost is saved. It is appreciated that in a case where the light guide pipe 3 with the shorter second main body 33 is mounted on the side wall 11 of the housing 1, the second mating engagement portion 13 is free.

Figure 4:
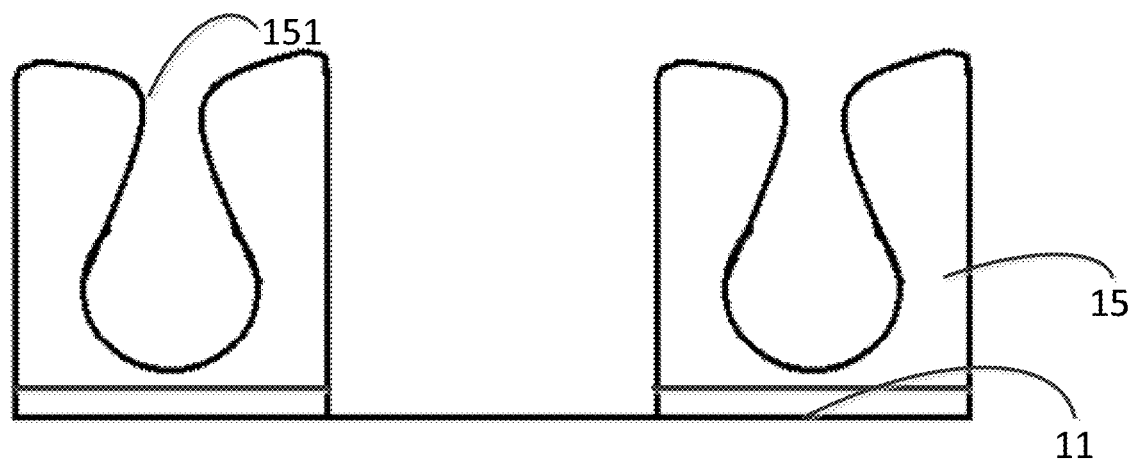
FIG. 4 is a schematic top view of a pair of mating engagement portions on a side wall of a housing according to an embodiment.

In an exemplary embodiment, as shown in FIGS. 2 to 4, each of the first lower engagement portion 231, the first upper engagement portion 232, and the second lower engagement portion 331 comprises a connection post 24 protruding from the main body and a flange 25 protruding radially from an end of the connection post 24. Each of the first mating engagement portion 12 and the second mating engagement portion 13 comprises a pair of support arms 15 extending outwardly from the side walls 11 of the housing 1. The connection post 24 is clamped between the support arms 15. Further, the support arms 15 are provided with protruding portions 151 extending toward each other and adapted to hold the connection post 24 between the support arms to prevent the connection post 24 from being disengaged from between the support arms 15.

In an exemplary embodiment, as shown in FIG. 1, at least one of side walls 11 of each housing 1 is formed with a narrowed portion 16 concaved inwardly. The light guide pipe 2, 3 is mounted outside the narrowed portion 16. In this way, a space occupied by the entire electronic device may be reduced.

In an exemplary embodiment, as shown in FIG. 1, the narrowed portions 16 of the at least one pair of adjacent housings 1 face each other. In an exemplary embodiment of the disclosure, the electronic device may comprise a quad small form-factor pluggable double-density (QSFP-DD) connector. In an exemplary embodiment of the disclosure, the electronic device may comprise four sub-electronic modules. In this case, the housing 1 of each of the sub-electronic modules has a narrowed portion, and the narrowed portions 16 of the housings 1 of the two sub-electronic modules in the middle face each other. The two light guide pipes 2 and 3 are mounted between the narrowed portions 16 of the housings 1 of the two sub-electronic modules in the middle. On the other hand, the narrowed portions 16 of the two sub-electronic modules located on the outermost side face outside. In this way, it is possible to further reduce the space occupied by the entire electronic device while ensuring that each sub-electronic module has one light guide pipe.

Figure 5:
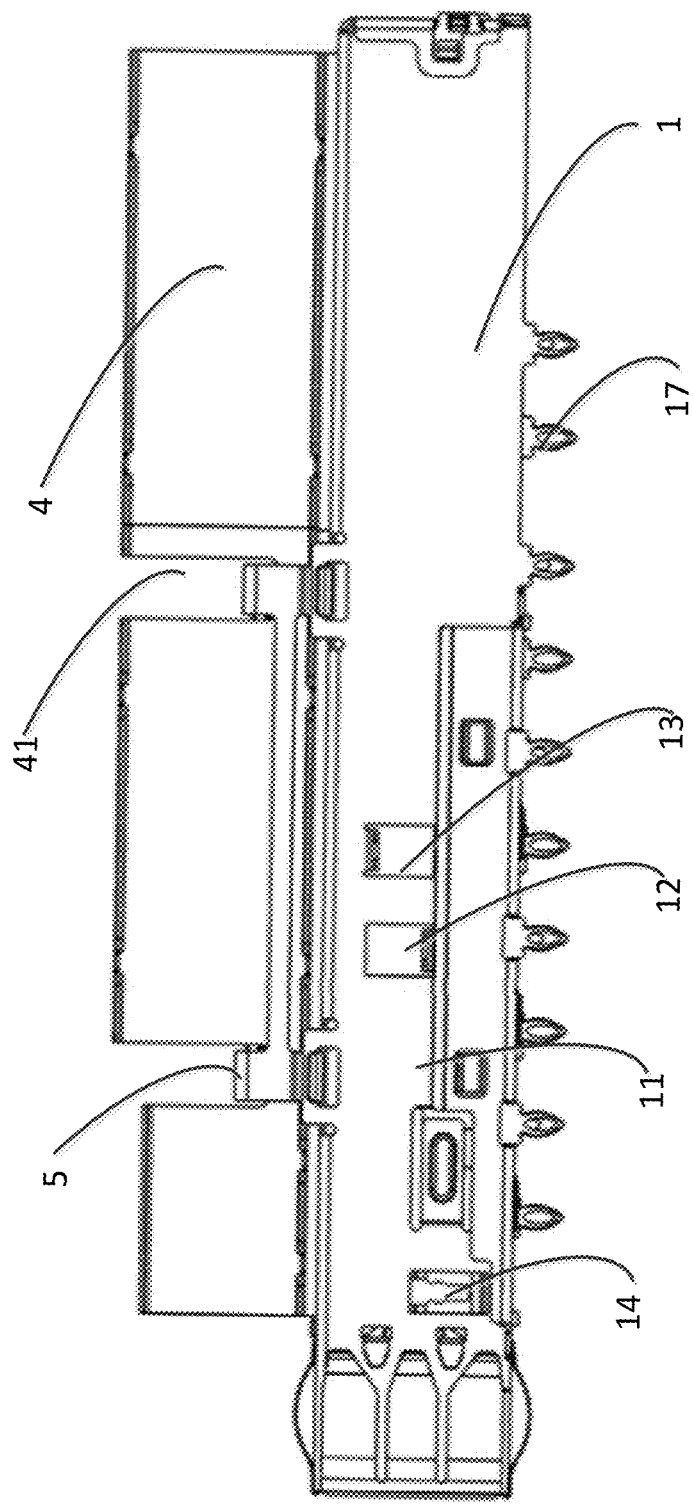
FIG. 5 is a side view of an electronic device assembly according to an embodiment without a light guide pipe mounted on a side wall of a housing.
Figure 6:
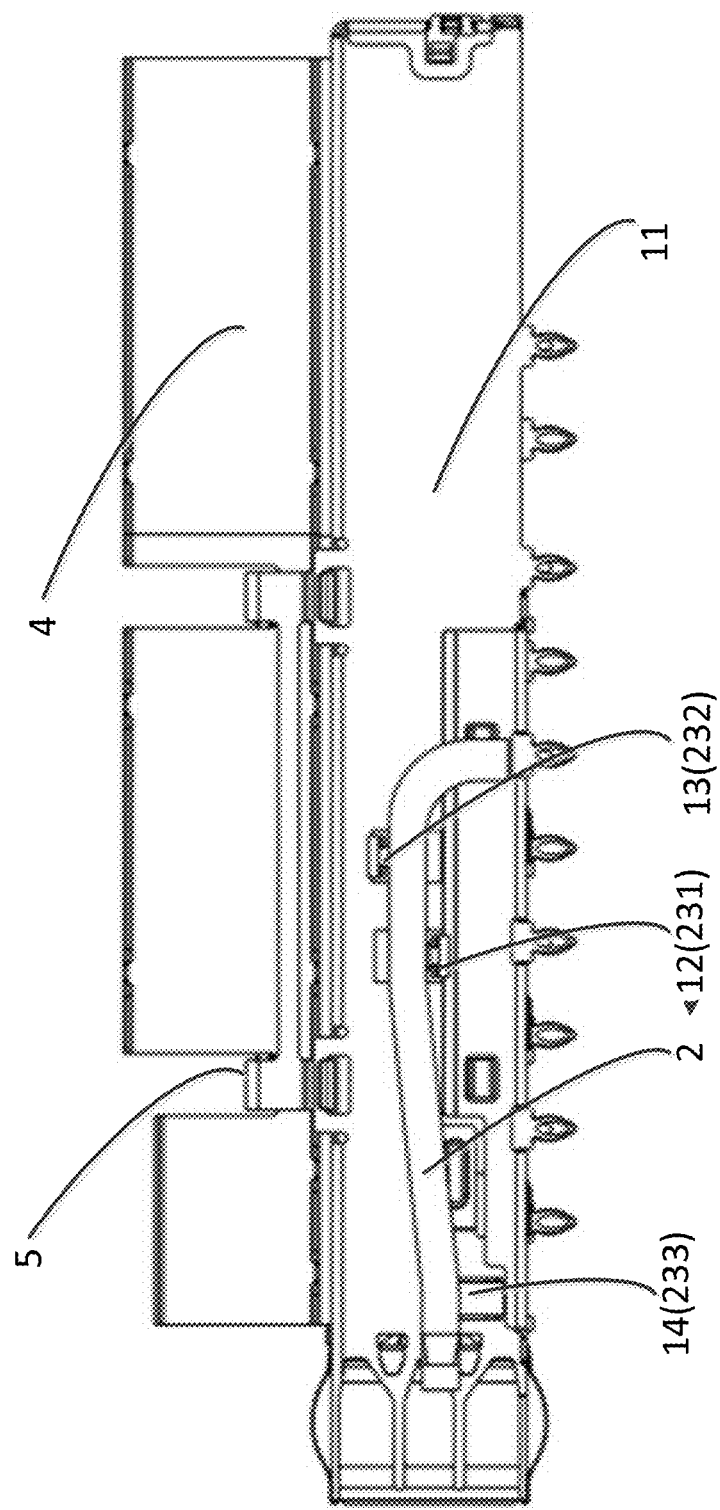
FIG. 6 is a side view of an electronic device assembly according to an embodiment with a longer light guide pipe mounted on a side wall of a housing.
Figure 7:
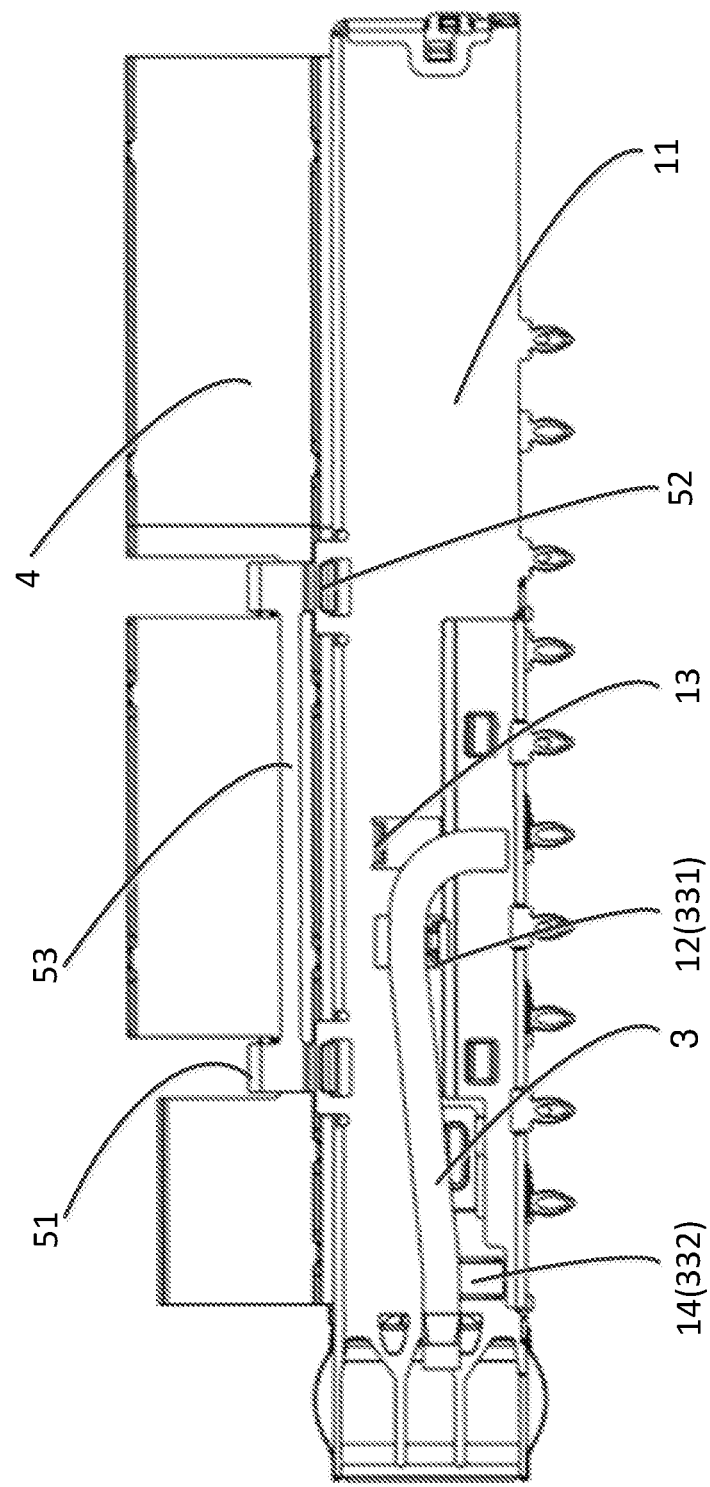
FIG. 7 is a side view of an electronic device assembly according to an embodiment with a shorter light guide pipe mounted on a side wall of a housing.

In an exemplary embodiment, as shown in FIGS. 5 to 7, each of the sub-electronic modules further comprises a radiator 4 mounted on the upper portion of the housing 1. The radiator 4 passes through the housing 1 to be brought in contact with an electronic unit mounted within the housing 1, thereby dissipating heat generated by the electronic unit. Further, the radiator 4 is provided with a plurality of mounting grooves 41. The electronic device further comprises a connection member 5 provided with a holding portion which is mounted in the mounting groove 41. The connection member 5 comprises a main body 51 having connection ends 52 at both ends thereof, the connector ends being connected to a mating connection member formed on the side wall 11 of the housing 1 in a snap-fit manner. A cross arm 53 is provided between the two main bodies 51, in this way, the connection member 5 has a substantially rectangular parallelepiped shape.

According to an exemplary embodiment, as shown in FIGS. 1 and 5 to 7, there is provided an electronic module comprising a housing 1 and two light guide pipes 2 and 3. The housing 1 has a top wall, a bottom wall and two side walls 11. The two light guide pipes 2 and 3 are mounted outside the two side walls 11 of the housing 1, respectively. Each of the light guide pipe comprises an incident end 21 or 31, an emergent end 22 or 32 at the front portion of the housing, and a main body 23, 33 extending between the incident end 21 or 31 and the emergent end 22 or 32 in a length direction of the side wall 11. The incident ends 21 or 31 of the two light guide tubes 2 and 3 are staggered by the predetermined distance D in the length direction of the side wall 11.

In an exemplary embodiment, the housing 1 is provided with two insertion ports which are adapted to an insertion of two electronic devices such as optical modules at the front thereof. In this way, the two electronic modules are arranged side by side to form the electronic device shown in FIG. 1.

It can be understood that each of the electronic module comprises two sub-electronic modules arranged side by side.

As shown in FIG. 1, an electronic device assembly according to another embodiment of the disclosure comprises a circuit board 200 on which a plurality of light-emitting device 201 such as light-emitting diodes are mounted, and the electronic device described in any one of the above embodiments. The incident end 21 or 31 of each of the light guide pipes 2 and 3 is arranged to face the respective light-emitting device 201, as shown in FIG. 2, so that a light emitted by the light-emitting device 201 is incident into the incident end 21 or 31 of the light guide pipe 2 or 3 and then exits from the emergent end 23 or 33 to outside through the first body 23 or the second body portion 33. In this way, the operator may judge the working status of the electronic module of the electronic device by observing the light emission at the emergent end 22 or 23 of the light guide pipe 2 or 3 from the front of the panel.

It should be appreciated by those skilled in this art that the above embodiments are intended to be illustrative, and many modifications may be made to the above embodiments by those skilled in this art. Further, various structures described in various embodiments may be freely combined with each other without conflicting in configuration or principle.

Although the disclosure have been described hereinbefore in detail with reference to the attached drawings, it should be appreciated that the disclosed embodiments in the attached drawings are intended to illustrate embodiments of the disclosure by way of example, and should not be construed as limitation to the disclosure.

Although a few embodiments of the general inventive concept of the disclosure have been shown and described, it would be appreciated by those skilled in the art that changes or modifications may be made to these embodiments without departing from the principles and spirit of the general inventive concept, the scope of which is defined in claims and their equivalents.

It should be noted that, the word "comprise" doesn't exclude other elements or steps, and the word "a" or "an" doesn't exclude more than one. In addition, any reference numerals in the claims should not be interpreted as the limitation to the scope of the disclosure.

What is claimed is:

1. An electronic device, comprising:
a plurality of sub-electronic modules arranged side by side, each of the sub-electronic modules including:
a housing having a top wall, a bottom wall, and a pair of side walls; and
a light guide pipe mounted on one of the side walls and having an incident end, an emergent end located at a front portion of the housing, and a main body located between the incident end and the emergent end and extending in a length direction of the housing, the incident ends of the light guide pipes located between at least a pair of adjacent housings are staggered by a predetermined distance in the length direction.

2. The electronic device of claim 1, wherein the predetermined distance is not less than a maximum outer diameter of the incident end.

3. The electronic device of claim 1, wherein the light guide pipe has a substantially L shape, and the incident end is substantially perpendicular to the main body and extends in a height direction.

4. The electronic device of claim 3, wherein a first main body of the main bodies of the light guide pipes has a length greater than that of a second main body of the main bodies of the two light guide pipes.

5. The electronic device of claim 4, wherein the first main body has a first lower engagement portion on a lower portion thereof, a first upper engagement portion on an upper portion thereof, and a first side engagement portion on a side wall thereof.

6. The electronic device of claim 5, wherein the second main body has a second lower engagement portion on a lower portion thereof and a second side engagement portion on a side wall thereof.

7. The electronic device of claim 6, wherein the one of the side walls of the housing has, on an outer side thereof, a first mating engagement portion mated with the first lower engagement portion or the second lower engagement portion, a second mating engagement portion mated with the first upper engagement portion, and a third mating engagement portion mated with the first side engagement portion or the second side engagement portion.

8. The electronic device of claim 7, wherein each of the first lower engagement portion, the first upper engagement portion, and the second lower engagement portion has a connection post protruding from the main body and a flange protruding radially from an end of the connection post.

9. The electronic device of claim 8, wherein each of the first mating engagement portion and the second mating engagement portion has a pair of support arms extending outwardly from the side walls of the housing, the connection post is clamped between the support arms.

10. The electronic device of claim 1, wherein at least one of side walls of each housing has a narrowed portion concaved inwardly, the light guide pipe is mounted outside the narrowed portion.

11. The electronic device of claim 10, wherein the narrowed portions of the at least one pair of adjacent housings are arranged to face each other.

12. The electronic device of claim 1, wherein each of the sub-electronic modules has a radiator mounted on an upper portion of the housing.

13. The electronic device of claim 12, wherein the radiator has a plurality of mounting grooves.

14. The electronic device of claim 13, further comprising a connection member having a holding portion mounted in the mounting grooves.

15. The electronic device of claim 14, wherein the connection member has a main body having connection ends at both ends thereof, the connection ends are connected to a mating connection member formed on one of the side walls of the housing in a snap-fit manner.

16. The electronic device of claim 1, wherein the electronic device is a quad small form-factor pluggable double-density connector.

17. An electronic module, comprising:
a housing having a top wall, a bottom wall, and a pair of side walls; and
a pair of light guide pipes each mounted outside one of the side walls of the housing, each of the light guide pipes having an incident end, an emergent end located at a front portion of the housing, and a main body located between the incident end and the emergent end and extending in a length direction of the side walls, the incident ends of the light guide pipes are staggered by a predetermined distance in the length direction.

18. The electronic module of claim 17, wherein the housing has a pair of insertion ports at the front portion.

19. An electronic device assembly, comprising:
a circuit board on which a plurality of light-emitting devices are mounted; and
an electronic device including a plurality of sub-electronic modules arranged side by side, each of the sub-electronic modules including:
  a housing having a top wall, a bottom wall, and a pair of side walls; and
  a light guide pipe mounted on one of the side walls and having an incident end, an emergent end located at a front portion of the housing, and a main body located between the incident end and the emergent end and extending in a length direction of the housing, the incident ends of the light guide pipes located between at least a pair of adjacent housings are staggered by a predetermined distance in the length direction, the incident end of each of the light guide pipes is arranged to face one of the light-emitting devices.

* * * * *